(12) United States Patent
Brebner (10) Patent No.: US 7,636,908 B1
(45) Date of Patent: Dec. 22, 2009

(54) GENERATION OF A SPECIFICATION OF A NETWORK PACKET PROCESSOR

(75) Inventor: Gordon J. Brebner, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 344 days.

(21) Appl. No.: 11/818,792

(22) Filed: Jun. 14, 2007

(51) Int. Cl.
*G06F 17/50* (2006.01)

(52) U.S. Cl. .......................................... 716/18; 716/17

(58) Field of Classification Search ........................ None
See application file for complete search history.

(56) References Cited

U.S. PATENT DOCUMENTS

| | | | |
|---|---|---|---|
| 6,477,683 B1 * | 11/2002 | Killian et al. | 716/1 |
| 6,665,725 B1 | 12/2003 | Dietz et al. | |
| 6,687,247 B1 | 2/2004 | Wilford et al. | |
| 6,794,896 B1 | 9/2004 | Brebner | |
| 7,398,502 B1 | 7/2008 | Kulkarni et al. | |
| 7,552,042 B1 * | 6/2009 | Brebner et al. | 703/14 |
| 2002/0176378 A1 | 11/2002 | Hamilton et al. | |
| 2003/0177187 A1 | 9/2003 | Levine et al. | |
| 2008/0002576 A1 | 1/2008 | Bugenhagen et al. | |
| 2008/0002670 A1 | 1/2008 | Bugenhagen et al. | |
| 2008/0002676 A1 | 1/2008 | Wiley et al. | |
| 2008/0002716 A1 | 1/2008 | Wiley et al. | |
| 2008/0005156 A1 | 1/2008 | Edwards et al. | |
| 2008/0049626 A1 | 2/2008 | Bugenhagen et al. | |
| 2008/0049628 A1 | 2/2008 | Bugenhagen | |
| 2008/0049630 A1 | 2/2008 | Kozisek et al. | |
| 2008/0049769 A1 | 2/2008 | Bugenhagen | |
| 2008/0049927 A1 | 2/2008 | Wiley et al. | |
| 2008/0052387 A1 | 2/2008 | Heinz et al. | |
| 2008/0052393 A1 | 2/2008 | McNaughton et al. | |
| 2008/0052394 A1 | 2/2008 | Bugenhagen et al. | |

OTHER PUBLICATIONS

Attig, Michael et al., "Systematic Characterization of Programmable Packet Processing Pipelines", Field-Programmable Custom Computing Machines, 2006. FCCM apos;06. 14th Annual IEEE Symposium Apr. 2006, pp. 195-204, IEEE, 3 Park Avenue, 17th Floor, New York, NY 10016-5997.

(Continued)

*Primary Examiner*—Leigh Marie Garbowski
(74) *Attorney, Agent, or Firm*—LeRoy D. Maunu; Lois D. Cartier (57) ABSTRACT

Methods are provided for generating a hardware description language (HDL) specification of a network packet processor from a first, second, and third specification. The first specification specifies at least one handler of the network packet processor for processing input network packets and producing output network packets. Each handler processes a corresponding type of network packets and includes one or more actions for inspecting and modifying fields of the corresponding type of network packets. The second specification specifies a plurality of characteristics of a plurality of ports of the network packet processor. The characteristics include respective data widths of the ports. The ports include one or more input ports for receiving the input network packets and one or more output ports for transmitting the output network packets. The third specification specifies one or more behavioral constraints of the network packet processor.

20 Claims, 8 Drawing Sheets

OTHER PUBLICATIONS

U.S. Appl. No. 10/769,330, filed Jan. 30, 2004, James-Roxby, Philip B. et al., "Method and Apparatus for Multithreading on a Programmable Logic Device", 66 pages, available from Xilinx, Inc., 2100 Logic Drive, San Jose, California 95124.

U.S. Appl. No. 11/799,897, filed May 3, 2007, Brebner, Gordon J. et al., "Generation of a Specification of a Network Packet Processor", 30 pages, available from Xilinx, Inc., 2100 Logic Drive, San Jose, California 95124.

U.S. Appl. No. 11/799,860, filed May 3, 2007, Keller, Eric R. et al., "Pipeline for Processing network Packets", 29 pages, available from Xilinx, Inc., 2100 Logic Drive, San Jose, California 95124.

U.S. Appl. No. 11/799,953, filed May 3, 2007, James-Roxby, Philip B. et al., "Method For Scheduling A Network Packet Processor", 39 pages, available from Xilinx, Inc., 2100 Logic Drive, San Jose, California 95124.

U.S. Appl. No. 11/799,966, filed May 3, 2007, Keller, Eric R. et al., "Method For Simulating A Processor Of Network Packets", 36 pages, available from Xilinx, Inc., 2100 Logic Drive, San Jose, California 95124.

U.S. Appl. No. 11/799,898, filed May 3, 2007, Keller, Eric R. et al., "Circuit for Modification of a Network Packet by Insertion or Removal of a Data Segment", 42 pages, available from Xilinx, Inc., 2100 Logic Drive, San Jose, California 95124.

U.S. Appl. No. 11/818,788, filed Jun. 14, 2007, Attig, Michael E. et al., "Generation Of A Pipeline For Processing A Type Of Network Packets", 34 pages, available from Xilinx, Inc., 2100 Logic Drive, San Jose, California 95124.

U.S. Appl. No. 11/818,811, filed Jun. 14, 2007, Attig, Michael E. et al., "A Circuit For Processing network Packets", 33 pages, available from Xilinx, Inc., 2100 Logic Drive, San Jose, California 95124.

U.S. Appl. No. 11/818,722, filed Jun. 14, 2007, Brebner, Gordon J. et al., "Generation of a Specification of a Processor of Network Packets", 34 pages, available from Xilinx, Inc., 2100 Logic Drive, San Jose, California 95124.

U.S. Appl. No. 10/769,592, filed Jan. 30, 2004, Brebner, Gordon J. et al., "Method for Message Processing on a Programmable Logic Device", 67 pages, available from Xilinx, Inc., 2100 Logic Drive, San Jose, California 95124.

* cited by examiner

GENERATION OF A SPECIFICATION OF A NETWORK PACKET PROCESSOR

FIELD OF THE INVENTION

The present invention, generally relates to processors of network packets, and more particularly to generation of a network packet processor.

BACKGROUND

A network packet processor may input a stream of network packets, manipulate the contents of the network packets, and output another stream of modified network packets. The manipulations may implement a protocol for processing network packets. For example, the network packet processor may implement a protocol layer of a communication protocol, and for a high-level packet received from a higher protocol layer and delivered to a lower protocol layer for eventual transmission on the communication media, the manipulations may encapsulate the high-level packet within a low-level packet of the lower protocol layer.

A protocol designer may develop a specification of the processing of network packets by a network packet processor. A hardware designer, such as an integrated circuit designer, may create a hardware implementation of a network packet processor that complies with the requirements specified by the protocol designer. Thus, development of a network packet processor implemented in hardware may require the specialized knowledge and skills of at least two separate fields of expertise. Because multiple fields of expertise may be required during development of a hardware implementation of a network packet processor, development of a network packet processor may be time consuming and expensive.

Rapid development of the protocol or implementation of a network packet processor may improve the timeliness and/or quality of the network packet processor. For example, if a hardware implementation can be generated quickly given a specification of the processing of network packets, deficiencies discovered in an initial implementation may be addressed by modifying the specification and generating an improved implementation. Additional iterations of improvement may be possible if the hardware implementation can be generated quickly from a protocol specification.

The present invention may address one or more of the above issues.

SUMMARY OF THE INVENTION

Various embodiments of the invention provide a method for generating a hardware description language (HDL) specification of a network packet processor. A first specification is input in a textual language. The first specification specifies at least one handler of the network packet processor for processing input network packets and producing output network packets. Each handler processes a corresponding type of network packets and includes one or more actions for inspecting and modifying fields of the corresponding type of network packets. A second specification is input in a textual language. The second specification specifies a plurality of characteristics of a plurality of ports of the network packet processor. The characteristics include respective data widths of the ports. The ports include one or more input ports for receiving the input network packets and one or more output ports for transmitting the output network packets. A third specification is input in a textual language. The third specification specifies one or more behavioral constraints of the network packet processor. A fourth specification of the network packet processor is generated in the HDL in response to the first, second, and third specifications.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
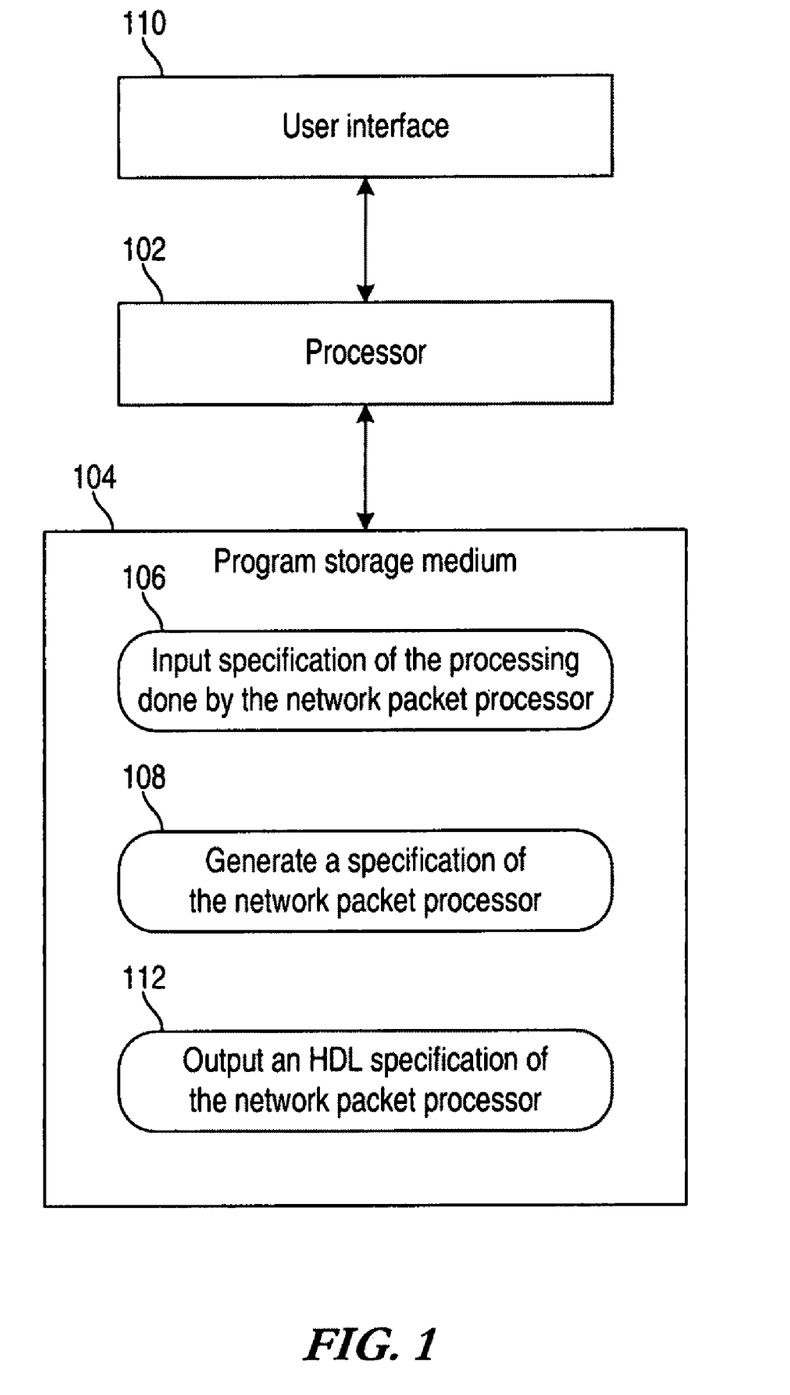
FIG. 1 is a block diagram of a system for generating a specification of a network packet processor in accordance with one or more embodiments of the invention.

FIG. 1 is a block diagram of a system for generating a specification of a network packet processor in accordance with one or more embodiments of the invention. A processor 102 reads and executes instructions from a program storage medium 104, and the execution of the instructions causes processor 102 to generate the specification of the network packet processor. Software modules 106, 108, and 112 may include the instructions of the program storage medium 104.

Execution of the instructions of software module 106 may cause processor 102 to input a specification of the processing to be performed by the network packet processor. In one embodiment, the network packet processor may receive network packets and transmit a modification of the received network packets. The specification of the processing by the network packet processor may be a protocol specification of the modifications to be performed by the network packet processor. For example, the network packet processor may implement a protocol layer of a communication protocol, and for a high-level packet received from a higher protocol layer and delivered to a lower protocol layer for eventual transmission on the communication media, the specification may describe the encapsulation of the high-level packet within a low-level packet of the lower protocol layer. The encapsulation specified by the protocol specification may include insertion of a header with a particular format before the beginning of the high-level packet. The header may be generated from information in the incoming high-level packet and from information that is stored within the network packet processor.

Execution of the instructions of software module 106 may cause processor 102 to input the specification from the user interface 110. In one embodiment, the user interface 110 may permit directly inputting a textual language specification of the processing expected from the network packet processor. In another embodiment, the textual language specification may be input from a data file stored in program storage medium 104 or another storage medium of the system.

Execution of the instructions of software module 108 may cause processor 102 to generate a specification of the network packet processor from the textual language specification input by processor 102 during execution of the instructions of software module 106. The network packet processor generated using software module 108 may implement the manipulations of the textual language specification. Execution of the instructions of software module 112 may cause processor 102 to output an HDL specification of the network packet processor.

Figure 2:
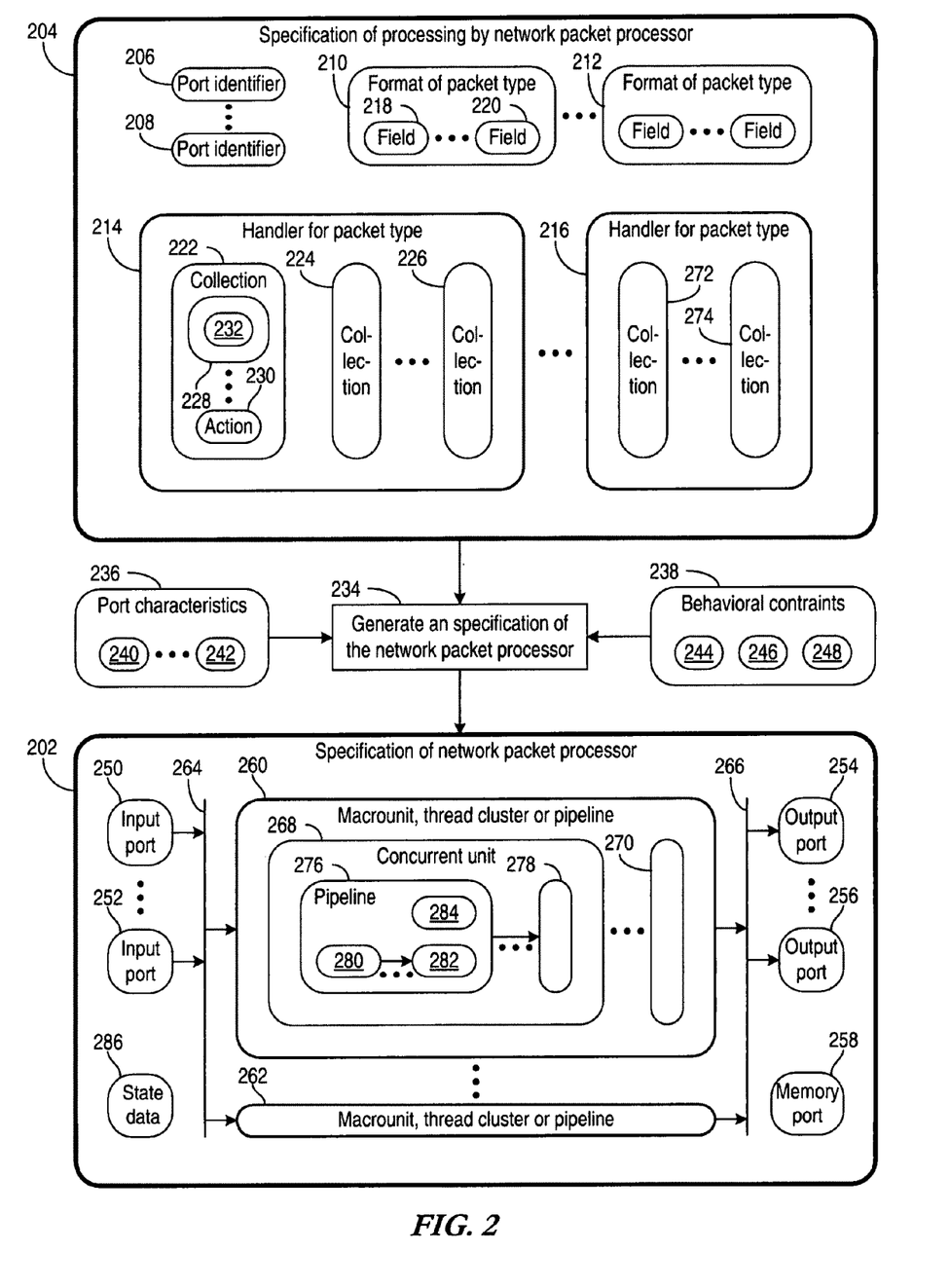
FIG. 2 is a data flow diagram of a process for generating a specification of a network packet processor in accordance with various embodiments of the invention.

FIG. 2 is a data flow diagram of a process for generating a specification 202 of a network packet processor in accordance with various embodiments of the invention. The specification 202 may be generated from a textual language specification 204 of the processing performed by the network packet processor. In one embodiment, specification 202 may be specified in a hardware description language, such as Verilog or VHDL.

The textual language specification 204 of the network packet processor may include port identifiers 206 and 208, formats 210 and 212 for one or more types of network packets and possibly other data structures, and one or more handlers 214 and 216 for processing a corresponding type of network packet. The port identifiers 206 and 208 may include respective identifiers for the input ports, output ports, and any peripheral ports, such as memory ports, of the network packet processor. Format 210 may include fields 218 and 220 of a type of network packet, and a field 218 or 220 may be declared in the format 210 as having a specified name and a specified size, such as a number of data bits of the field. The fields 218 and 220 may be specified in format 210 in an order corresponding to an order of the network packet manager receiving or transmitting the fields in the type of network packets.

A handler 214 may include collections 222, 224, and 226 of actions 228 and 230 for manipulating network packets of a particular type. Each collection 222, 224, and 226 may include one or more actions. In one embodiment, the collection 222 of actions 228 and 230 is indicated in specification 204 by enclosing a grouping of statements for actions 228 and 230 within curly brace delimiters.

Examples for actions 228 and 230 include a set action for setting a value of field 218 as a function of local and global variables and/or fields 218 and/or 220, an insert action for data insertion at field 218 as a function of local and global variables and/or fields 218 and/or 220, a remove action for data removal at field 218 as a function of local and global variables and/or fields 218 and/or 220, an update action for updating one of the local or global variables as a function of local and global variables and/or fields 218 and/or 220, a forward action for transmitting network packets to a destination following the manipulations of handler 214, a memory read action for reading a value from a memory, a memory write action for writing a value to the memory, and a handle action for invoking another handler 216.

An action 228 may include a guard condition 232 for enabling and disabling the action 228, with the action 228 performed in response to the guard condition 232 being satisfied and the action 228 being bypassed in response to the guard condition 232 not being satisfied. Another action 230 might not include a guard condition and the action 230 may always be performed on each network packet that is processed using handler 214. Examples for guard condition 232 include a check of a value of a field 218 of a type of the network packets, a comparison between two fields 218 and 220 of a type of the network packets, and a comparison between a field 218 and a local or global variable.

At step 234, the specification 202 of the network packet processor is generated from the specification 204 of the processing performed by the network packet processor. The generation of the specification 202 of the network packet processor may be guided by port characteristics 236 and/or behavioral constraints 238. Port characteristics 236 may include various characteristics 240 and 242 of the ports identified by port identifiers 206 and 208. For example, characteristic 240 may specify a width of the port with port identifier 206 and characteristic 242 may specify a signaling protocol for the port with port identifier 208. Behavioral constraints 238 may include various constraints 244, 246, and 248. For example, constraint 244 may be a constraint on a circuit area for the network packet processor, constraint 246 may be a constraint on a power consumption of the network packet processor, and constraint 248 may be a constraint on a timing of the network packet processor. Example constraints on the timing of a network packet processor include a constraint on a throughput of the network packet processor, a constraint on a latency of the network packet processor, a constraint on an operating frequency of the network packet processor, or a constraint on a propagation delay of a stage of a pipeline within the network packet processor.

The specification 202 of the network packet processor is generated from the specification 204 of the processing of network packets by the network packet processor. Some structures of the specification 202 of the network packet processor may correspond fairly directly with the specification 204 of the processing of network packets by the network packet processor. This correspondence may allow user manipulation of certain features of the network packet processor in an iterative design approach.

The specification 202 may include the ports 250, 252, 254, 256, and 258 corresponding to the ports and type of the ports that are identified by port identifiers 206 and 208 of specification 204. Thus, a user may modify the specification 204 to control the number of ports and the type, such as input or output, of each of the ports. The ports 250, 252, 254, 256, and 258 may also have characteristics, such as width or signaling protocol, that are specified by port characteristics 236.

The processing of network packets may be primarily performed by the macrounits 260 and 262 of the specification 202 of the network packet processor. Each macrounit 260 or 262 may correspond with one or more of handlers 214 and 216. The actions 228 and 230 of a handler 214 may include a handle action for invoking another handler 216. If a handler 214 includes a handle action for invoking a handler 216, then the handlers 214 and 216 are interdependent handlers. When a macrounit 260 or 262 corresponds to more than one of handlers 214 to 216, then the handlers that correspond to the macrounit are interdependent handlers. Frequently, a series of handlers 214 to 216 may be interdependent because each handler in the series includes a handle action for invoking the next handler in the series. For example, a communication protocol may have network, transport, and data link layers and the specification 204 may include a transmit handler 214 to 216 for each layer of the communication protocol. The transmit handler for the network layer may include a handle action for invoking the transmit handler for the transport layer, and the transmit handler for the transport layer may include a handle action for invoking the transmit handler of the data link layer.

Each handler 214 to 216 that does not include a handle action and is not invoked by a handle action in another handler is an independent handler, and one of the macrounits 260 and 262 corresponds to the independent handler. Because macrounits 260 and 262 can process network packets in parallel, macrounits 260 and 262 may also be denoted parallel units.

A distributor 264 may distribute received network packets or fields of the network packets from the input ports 250 and 252 to the macrounits 260 and 262. For example, handler 214 may correspond to macrounit 260 and port identifier 206 may correspond to input port 250. Distributor 264 may distribute a type of network packets from input port 250 to macrounit 260 because handler 214 processes this type of network packets from the port with port identifier 206. Distributor 264 may distribute different types of network packets received at input port 250 to respective macrounits 260 and 262. Distributor may distribute a particular type of network packets received from multiple input ports 250 and 252 to one of the macrounits 260 and 262.

A gatherer 266 may gather network packets or fields of the network packets from the macrounits 260 and 262 for transmission at the output ports 254 and 256. A handler 216 with corresponding macrounit 262 may include a forward action specifying a port identifier 208. Gatherer 266 may transfer network packets from the macrounit 262 to the output port 256 that corresponds to the port identifier 208. Gatherer 266 may transfer network packets from multiple macrounits 260 or 262 to a particular one of output ports 254 and 256.

A macrounit 260 may include one or more concurrent units 268 and 270. Each concurrent unit 268 or 270 of macrounit 260 corresponds to one of the collections 222, 224, 226, 272, and 274 of the handlers 214 and/or 216 that correspond to the macrounit 260. For example, concurrent unit 268 may correspond to collection 272 of handler 216 and concurrent unit 270 may correspond to collection 274 of handler 216. Because a handler might include only one collection of actions or a handler might include only actions and not collections of actions, a concurrent unit 268 or 270 of macrounit 260 may correspond to an entire handler.

Each macrounit 260 and 262 may have an architecture that is either a pipeline or a thread cluster. For a macrounit 260 that is a pipeline, the concurrent units 268 and 270 may be stages of the pipeline that implements the macrounit 260. For a macrounit 260 that is a thread cluster, the concurrent units 268 and 270 may be threads of the thread cluster that implements the macrounit 260. During step 234 of the generation of the specification 202 of the network packet processor, the architecture of macrounits 260 and 262 may be automatically selected to, for example, satisfy the constraints 238.

The implementation of the concurrent units 268 and 270 may be essentially the same regardless of the architecture selected for the macrounit 260. However, the interfacing logic between the concurrent units 268 and 270 within macrounit 260 may depend on whether a pipeline or a thread cluster is selected for the architecture of macrounit 260.

Concurrent unit 268, for example, may correspond to collection 222 and may be implemented as a pipeline of stages 276 and 278 regardless of whether the architecture of macrounit 260 is a pipeline or a thread cluster. The actions 228 and 230 of collection 222 may be assigned to stages 276 and 278 as later discussed in connection with FIGS. 7, 8, and 9. Each stage 276 and 278 of concurrent unit 268 may also be implemented as a pipeline of stages 280 and 282 that are controlled by flow controller 284.

In one embodiment, the stages 280 to 282 may include one or more of a look-ahead stage, an operation stage, an insert/remove stage, and an interleave stage. The look-ahead stage may make certain of fields 218 and 220 concurrently available for processing according to the actions 228 and 230 of the handler 214, for example. The operation stage may implement the actions 228 and 230 that are not insert or remove actions. For each set action, the operation stage may set one of fields 218 and 220 according to the set action. The operation stage may evaluate a guard condition 232 for an action 228, and bypass performing the action 228 when the guard condition 232 is not satisfied. The insert/remove stage may perform data insertion and/or data removal at one or more of fields 218 and 220 according to the actions 228 and 230 that are insert or remove actions. The data insertion or data removal may be bypassed for an insert or remove action with a guard condition that is not satisfied. The interleave stage may ensure that modified network packet follows rules for interleaving network packets.

Certain actions 228 and 230 of a handler 214 may be memory read actions or memory write actions for accessing a memory of the network packet processor. A stage 276 or 278 that is assigned a memory read or write action may access the memory via memory port 258. Read data may be transferred from the memory via memory port 258, and write data and optionally a location address in the memory may be transferred to the memory via memory port 258. It will be appreciated that there may respective memory ports for multiple memories.

State data 286 may be stored information that is maintained between network packets. For example, information extracted by macrounit 260 from one network packet may be used by macrounit 262 to later modify another network packet. Each macrounit 260 or 262 may also include state data (not shown) that is used during the processing of each network packet.

Figure 3:
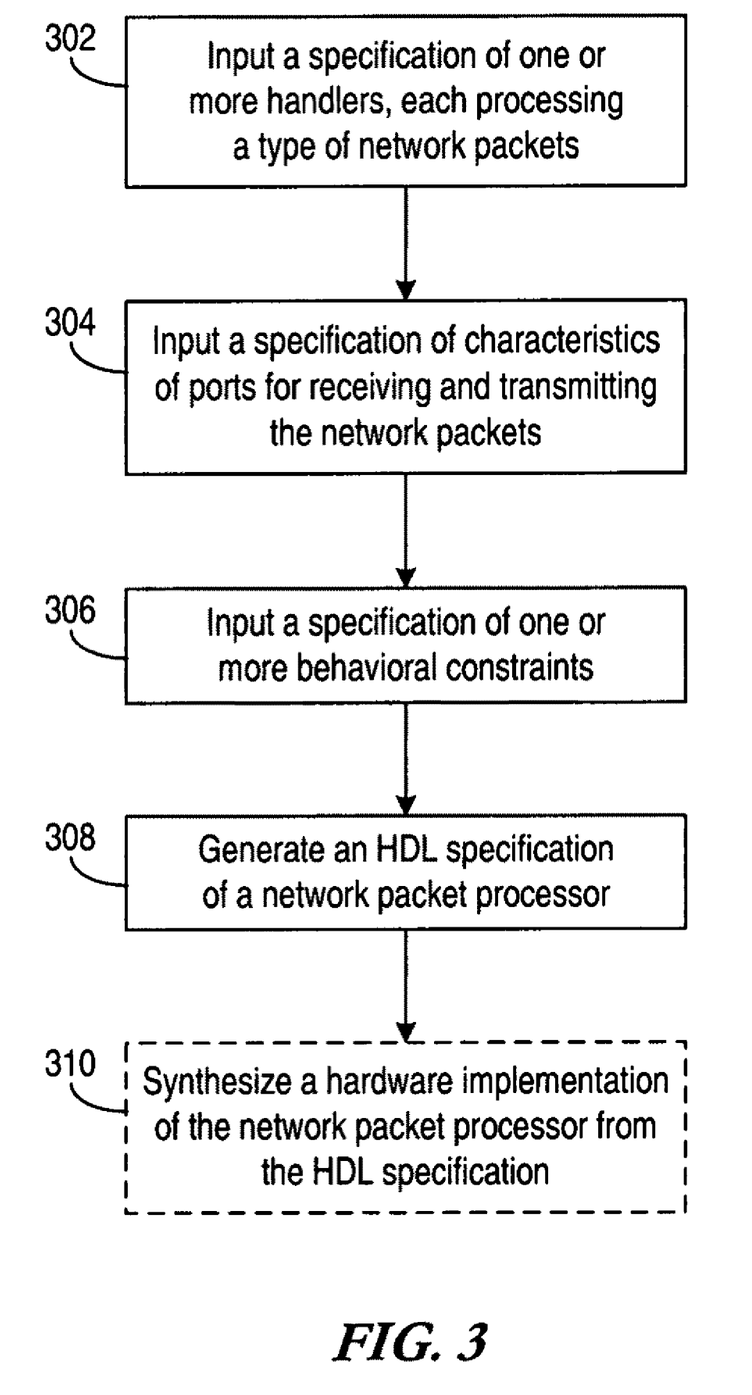
FIG. 3 is a flow diagram of a process for generating a specification of a network packet processor in a hardware description language in accordance with various embodiments of the invention.

FIG. 3 is a flow diagram of a process for generating a specification of a network packet processor in a hardware description language in accordance with various embodiments of the invention.

At step 302, a specification is input of handlers for processing one or more types of network packets. Each handler may include one or more collections of actions for processing at type of network packets. At step 304, a specification is input of characteristics of ports for receiving and transmitting the network packets. The specification may also include characteristics of peripheral ports, such as memory ports. The characteristics may include a width of a port and a signaling protocol for the port. At step 306, a specification is input of one or more behavioral constraints. The behavioral constraints may include a constraint on a circuit area, power consumption, and/or a timing of the network packet processor.

At step 308, a specification of the network packet processor is generated in a hardware description language (HDL), such as VHDL or Verilog. At optional step 310, a hardware implementation of the network packet processor is synthesized for the HDL specification. In one embodiment, a programmable logic device is configured to implement the network packet processor.

Figure 4:
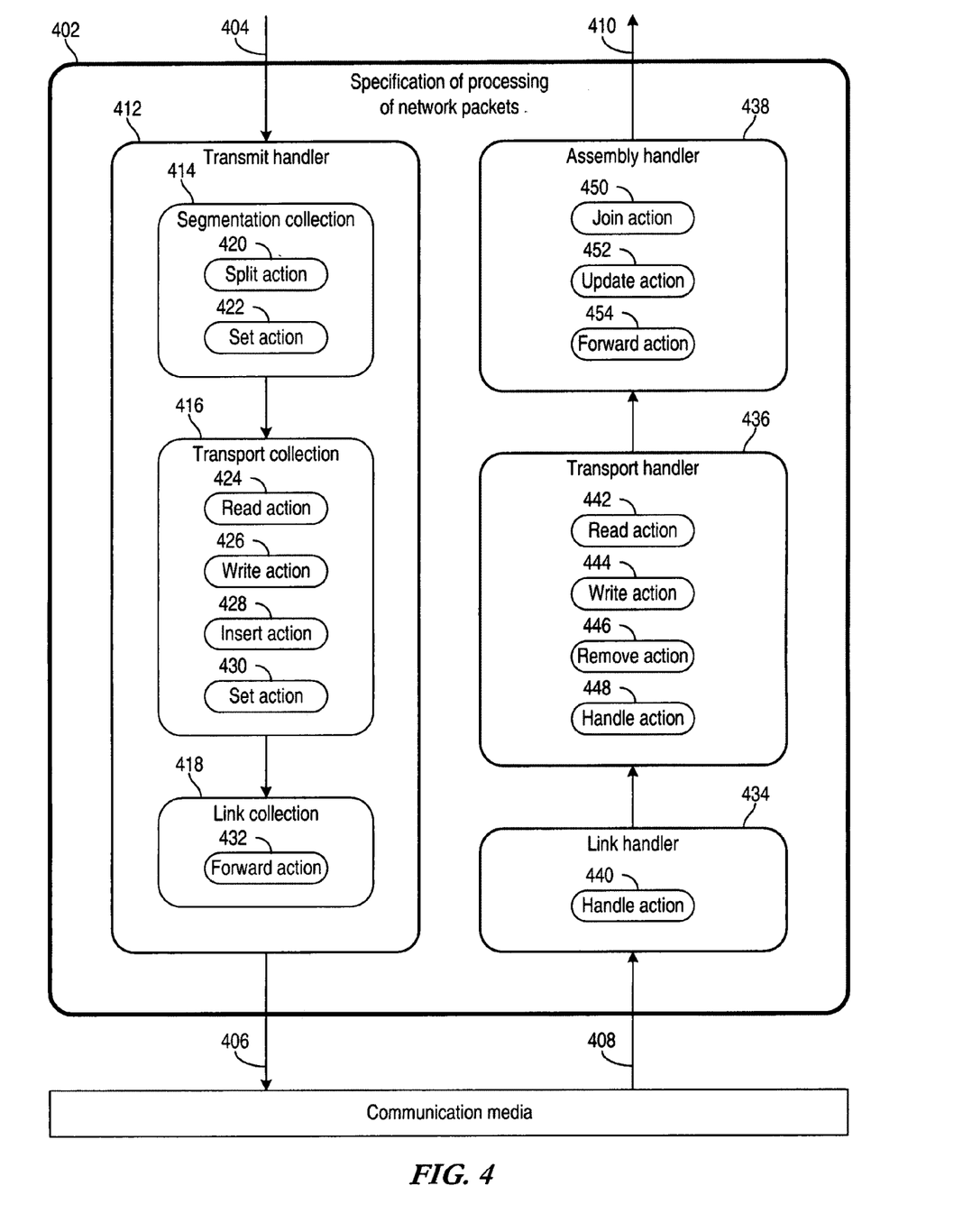
FIG. 4 is a block diagram illustrating an example specification of the processing of network packets in accordance with various embodiments of the invention.

FIG. 4 is a block diagram illustrating an example specification 402 of the processing of network packets in accordance with various embodiments of the invention. The example specification 402 may implement a communication protocol having multiple protocol layers.

The example specification 402 may specify an input port 404 for receiving data to be encapsulated in one or more network packets for transmission from output port 406. Another input port 408 may receive network packets and data extracted from these network packets may be output at output port 410.

The transmit handler 412 may encapsulate data received at input port 404 for transmission from output port 406. The transport handler 412 may be subdivided into the collections 414, 416, and 418 according to the layers of the communication protocol.

Each layer of the communication protocol may provide services that may be implemented using the services provided by another layer. For example, the link collection 418 may provide a service of unreliably transmitting network packets at output port 406. The transport collection 416 may provide a service of reliably transmitting network packets by using the link collection 418 to transmit the network packets as many times as needed to ensure successful transmission. The segmentation collection 414 may split data received at input port 404 into as many segments as needed to fit the data within the allowed size of the network packets. The segmentation collection 414 may transmit the data segments using the reliable transmission service of the transport collection 416.

The segmentation collection 414 may include a split action 420 for splitting data received at input port 404 into multiple data segments. Set action 422 may enter information into these network packets, such as information needed for reassembling the data segments of these network packets into contiguous data.

The transport collection 416 may include a memory read action 424 for reading information from a memory for tracking network packets and a memory write action 426 for updating the tracking information. The transport collection 416 may include an insert action 428 for inserting each data segment from the segmentation collection 414 into a network packet. The transport collection 416 may also include a set action 430 for updating fields in a header of the network packet.

The link collection 418 may include a forward action 432 for forwarding the network packets for transmission at output port 406.

Instead of dividing the layers of the communication protocol into the collections, in this example specification 402 the receiving side divides the layers of the communication protocol into handlers 434, 436, and 438. The receiving side of the example specification 402 includes the link handler 434, the transport handler 436, and the assembly handler 438. It will be appreciated that the lack of symmetry between the transmitting and receiving sides of the example specification 402 is merely illustrative of the design possibilities. A frequent design choice is to use only collections or only handlers to specify the layers of a communication protocol for both the transmitting and receiving sides.

The link handler 434 may include a handle action 440 for invoking the transport handler 436.

The transport handler 436 may include a memory read action 442 for reading information from a memory for tracking network packets and a memory write action 444 for updating the tracking information. The transport handler 436 may include a remove action 446 for extracting the data segment from the network packet. The transport handler 436 may also include a handle action 448 for invoking the assembly handler 438.

The assembly handler 438 may include a join action 450 for combining the data segments from multiple network packets into contiguous data. Update action 452 may, for example, update a length field in the combined data. The assembly handler 438 may include a forward action 454 for forwarding the combined data to the output port 410.

The handlers 434, 436, and 438 are interdependent handlers. The link handler 434 is dependent on the transport handler 436 because the link handler 434 includes a handle action 440 for invoking the transport handler 436. Similarly, the transport handler is dependent on the assembly handler 438 because the transport handler 436 includes a handle action 448 for invoking the assembly handler 438.

The set of handlers 434, 436, and 438 are independent from the transmit handler 412 because none of the handlers 434, 436, and 438 include a handle action for invoking the transmit handler 412, and the transmit handler 412 does not include a handle action for invoking any of the handlers 434, 436, and 438. Thus, the set of handlers 434, 436, and 438 and the set of handlers that includes only the transmit handler 412 are independent sets of handlers.

Figure 5:
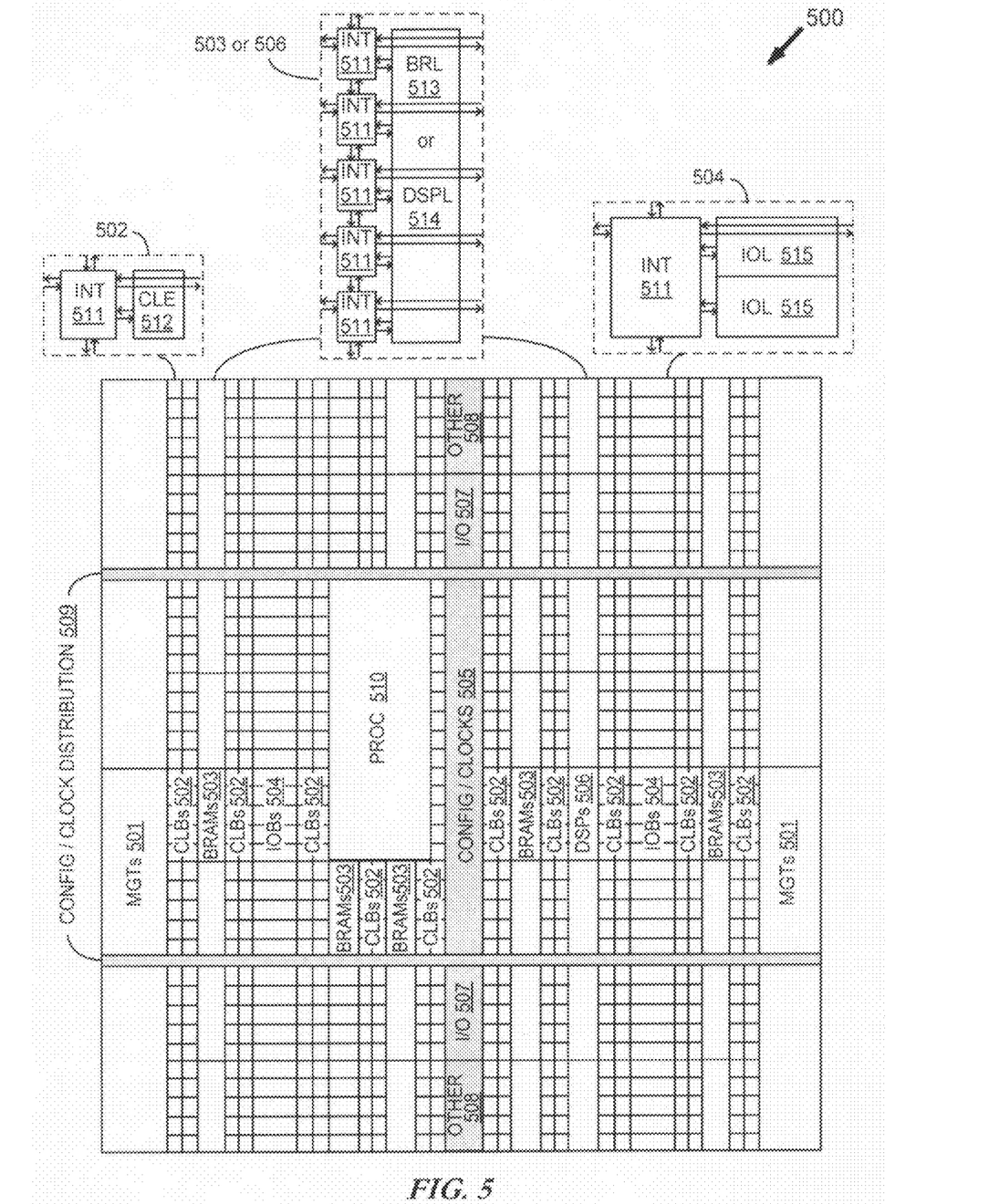
FIG. 5 is a block diagram of a programmable logic device useful for implementing a network packet processor in accordance with various embodiments of the invention.

FIG. 5 is a block diagram of a programmable logic device (PLD) useful for implementing a network packet processor in accordance with various embodiments of the invention.

A PLD, such as an FPGA, can include several different types of programmable logic blocks in the array. For example, FIG. 5 illustrates an FPGA architecture 500 that includes a large number of different programmable tiles including multi-gigabit transceivers (MGTs 501), configurable logic blocks (CLBs 502), random access memory blocks (BRAMs 503), input/output blocks (IOBs 504), configuration and clocking logic (CONFIG/CLOCKS 505), digital signal processing blocks (DSPs 506), specialized input/output blocks (I/O 507) (e.g., configuration ports and clock ports), and other programmable logic 508 such as digital clock managers, analog-to-digital converters, system monitoring logic, and so forth. Some FPGAs also include dedicated processor blocks (PROC 510).

In some FPGAs, each programmable tile includes a programmable interconnect element (INT 511) having standardized connections to and from a corresponding interconnect element in each adjacent tile. Therefore, the programmable interconnect elements taken together implement the programmable interconnect structure for the illustrated FPGA. The programmable interconnect element (INT 511) also includes the connections to and from the programmable logic element within the same tile, as shown by the examples included at the top of FIG. 5.

For example, a CLB 502 can include a configurable logic element (CLE 512) that can be programmed to implement user logic plus a single programmable interconnect element (INT 511). A BRAM 503 can include a BRAM logic element (BRL 513) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 506 can include a DSP logic element (DSPL 514) in addition to an appropriate number of programmable interconnect elements. An IOB 504 can include, for example, two instances of an input/output logic element (IOL 515) in addition to one instance of the programmable interconnect element (INT 511). As will be clear to those of skill in the art, the actual I/O pads connected, for example, to the I/O logic element 515 typically are not confined to the area of the input/output logic element 515.

In the pictured embodiment, a columnar area near the center of the die (shown shaded in FIG. 5) is used for configuration, clock, and other control logic. Horizontal areas 509 extending from this column are used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 5 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 6:
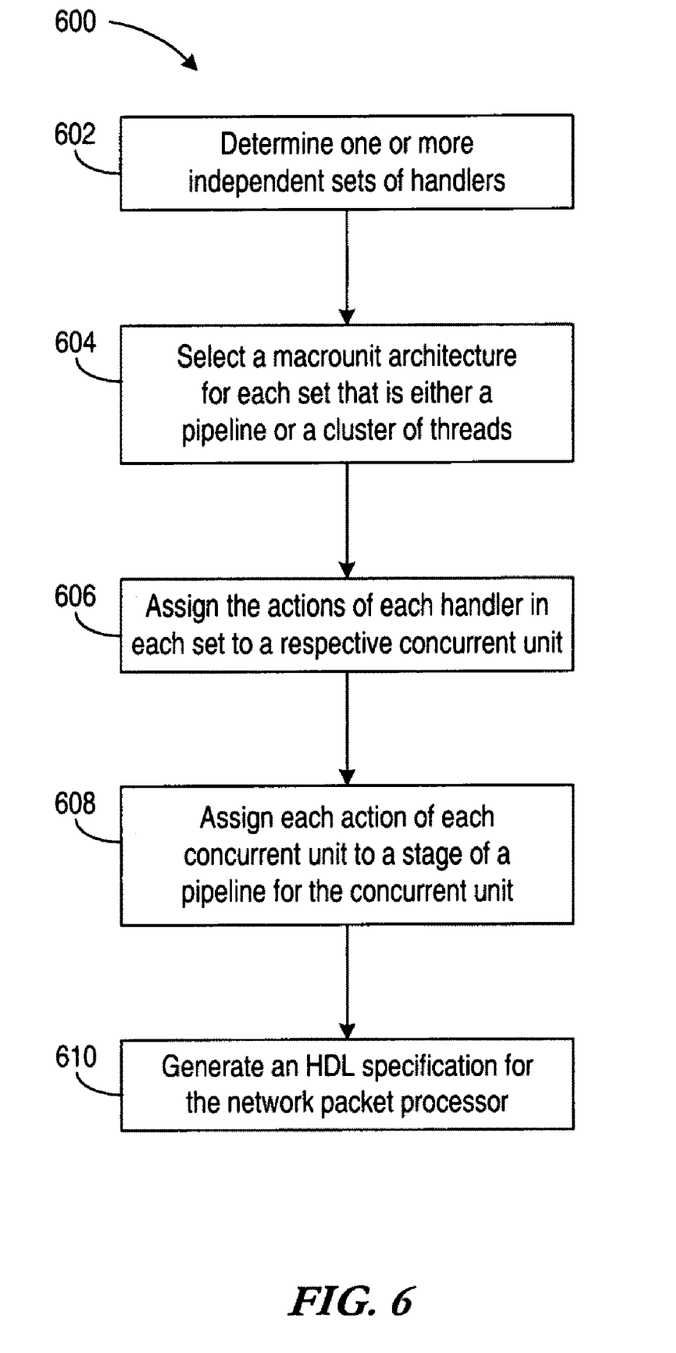
FIG. 6 is a flow diagram of a process for generating a specification of a processor of network packets in a hardware description language in accordance with various embodiments of the invention.

FIG. 6 is a flow diagram of a process 600 for generating a specification of a processor of network packets in a hardware description language (HDL) in accordance with various embodiments of the invention. The HDL specification is generated from a specification of the processing to be performed by the network packet processor. A protocol designer may specify the processing of the network packet processor. A protocol designer may use process 600 to generate an efficient hardware implementation of the network packet processor even if the protocol designer does not have hardware design skills.

At step 602, one or more independent sets of handlers are determined. Two handlers can be directly interdependent because one handler includes a handle action for invoking the other handler. Two handlers can also be indirectly interdependent because both handlers are interdependent with a third handler. Each handler in an independent set of handlers is either directly or indirectly interdependent with the other handlers in the independent set. For two independent sets of handlers, each handler of one independent set is not directly or indirectly interdependent with any handler in the other independent set.

In one embodiment, a graph is created with a node for each handler and an edge for each handle action in the handlers. The edge for a handle action connects the node for the handler including the handle action to the node for the handler that is invoked by the handle action. The independent sets of handlers may correspond to the connected components of this graph.

Each independent set of handlers corresponds to a macrounit of the HLD specification. At step 604, an architecture is selected for each macrounit and the selected architecture is either a pipeline or a thread cluster. In one embodiment, either the architecture is selected to be a pipeline for every macrounit or the architecture is selected to be a thread cluster for every macrounit. In another embodiment, the architecture is selected to be a pipeline for some of the macrounits and the architecture is selected to be a cluster of threads for the remaining macrounits. The architecture may be selected for a macrounit to meet various constraints, such as the number of resources needed to implement the macrounit in a PLD or a required throughput or operating frequency for the macrounit.

At step 606, the actions in the handlers of an independent set are assigned to one or more concurrent units of the macrounit that corresponds to the independent set of handlers. A macrounit may include one or more concurrent units for each handler in the independent set corresponding to the macrounit. Certain of the handlers in an independent set may include one or more collections of the actions. A macrounit may include a concurrent unit for each collection of actions in each handler in the independent set corresponding to the macrounit. For each collection of each handler in an independent set, the actions of the collection may be assigned to the concurrent unit that corresponds to the collection.

The concurrent units of a macrounit may have dependencies that reflect the interdependencies between the handlers and the collections of actions within the handlers. For example, the selected architecture for the macrounit may be a pipeline that has a stage for each concurrent unit, and the stages of the pipeline may be arranged in an order corresponding to a linear sequence of interdependencies between the handlers and the collections within the handlers. When the selected architecture is a cluster having a thread for each concurrent unit of the macrounit, the cluster may also enforce dependencies between the concurrent units corresponding to interdependencies between the handlers and the collections within the handlers.

For a handler including two collections of actions, the interdependencies between the collections may be indicated by the ordering of the specifications of the collections within the specification of the handler in one embodiment. In another embodiment, the collections can be named and each collection may have a guard condition that names one or more interdependent collections.

At step 608, the actions assigned to each concurrent unit are further assigned to one or more stages of a pipeline for implementing the concurrent unit. The actions of a concurrent unit may be assigned to the stages of the pipeline as further discussed below in connection with FIGS. 7, 8, and 9.

At step 610, an HDL specification is generated for the network packet processor. The specification specifies each macrounit, whether each macrounit is a pipeline or a thread cluster, and each concurrent unit of each macrounit. Each concurrent unit is a pipeline with one or more stages that implement the assigned actions. Each stage of the pipeline for a concurrent unit is another pipeline that may include a look-ahead stage, an operation stage, an insert/remove stage, and an interleave stage.

Figure 7:
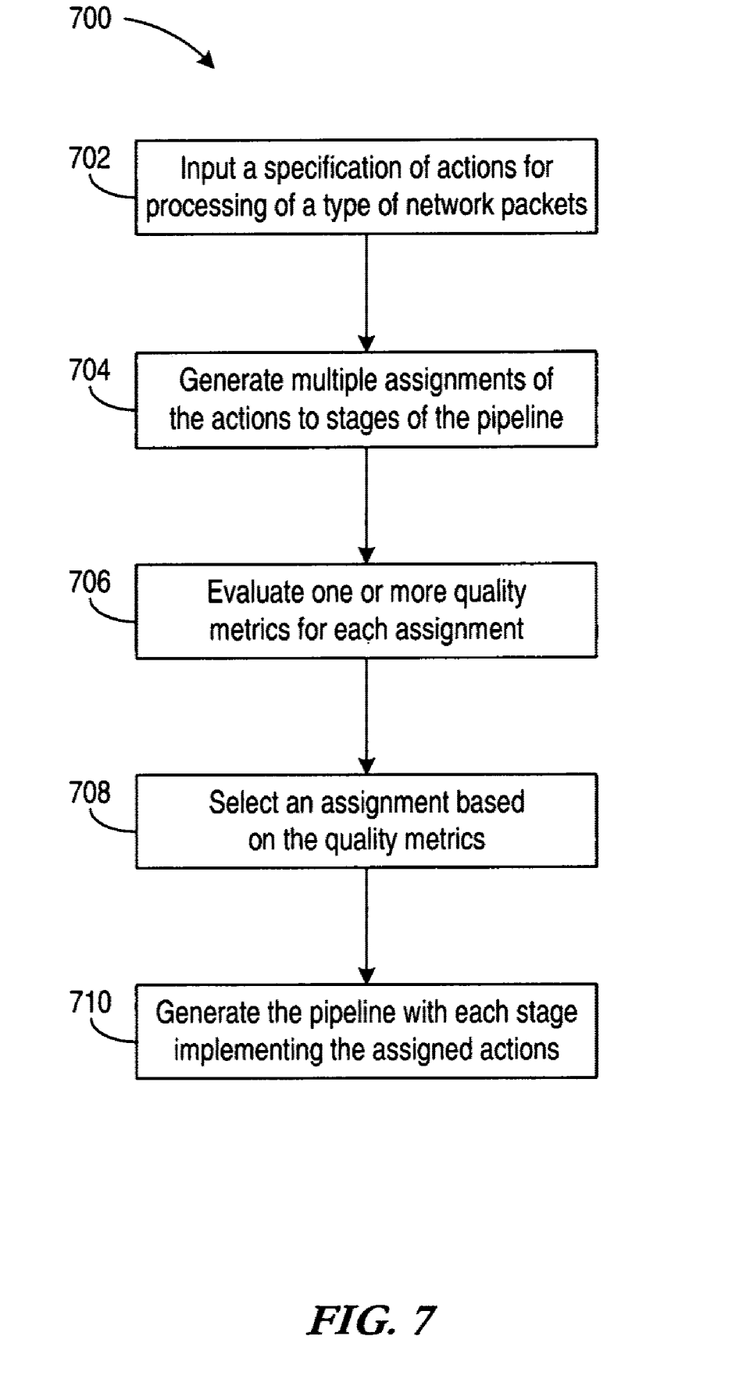
FIG. 7 is a flow diagram of a process for generating a pipeline for processing a type of network packets in accordance with various embodiments of the invention.

FIG. 7 is a flow diagram of a process 700 for generating a pipeline for processing a type of network packets in accordance with various embodiments of the invention. Process 700 may correspond to step 608 of process 600 of FIG. 6.

At step 702, a specification is input of actions for processing a type of network packets. The actions may be the actions of a handler that does not include collections of actions or the actions may be the actions in a collection of actions of a handler. At step 704, multiple assignments are generated, each assignment assigning the actions to one or more stages of a pipeline. The number of stages in the pipeline may vary between the assignments and the generation of each assignment may include selecting the number of stages in the pipeline.

At step 706, one or more quality metrics is evaluated for each of the assignments of the actions to the stages of the pipeline. At step 708, one of the assignments is selected based on the quality metrics. For example, there may be a permissible range or limit for each quality metric and a weighting for each quality metric. The selected quality metric may be the assignment with the best weighted average of the quality metrics from those assignments that have each quality metric within the permissible range or limit.

At step 710, the pipeline is generated for the selected assignment of the actions to the stages of the pipeline. The pipeline may implement a concurrent unit of a macrounit of a processor for processing network packets. Each stage of the pipeline may be an additional pipeline for implementing the actions assigned to the stage, and this additional pipeline may include one or more of a look-ahead stage, an operation stage, an insert/remove stage, and an interleave stage.

Figure 8:
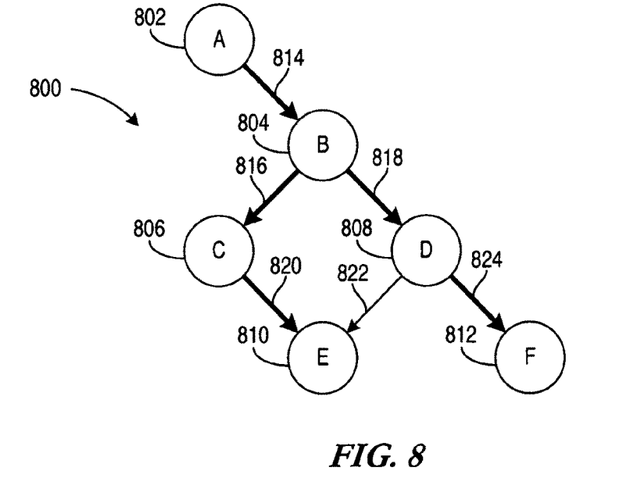
FIG. 8 is a diagram of an example dependency graph for generating a pipeline for processing a type of network packets in accordance with various embodiments of the invention.

FIG. 8 is a diagram of an example dependency graph 800 for generating a pipeline for processing a type of network packets in accordance with various embodiments of the invention. The nodes 802 and 812 may respectively correspond to an input port for receiving network packets and an output port for transmitting modified network packets, and the nodes 804, 806, 808, and 810 may correspond to respective actions. The edges 814 through 824 may indicate dependencies between the ports and the actions. The edges 814, 816, 818, 820, and 824 are shown with bold arrows to indicate the edges that are traversed in a breadth-first search of the dependency graph.

In one example, node 802 may correspond to an input port for receiving network packets and node 804 may correspond to a memory read action. The memory read action may read a memory at a location specified by an address taken from a field of the network packet. The edge 814 may indicate that the memory read action of node 804 cannot be performed until the appropriate field is obtained after the network packet is received at the input port of node 820. The value read by the memory read action of node 804 may be used as a guard conditions for enabling and disabling the actions of nodes 806 and 808. The edges 816 and 818 may indicate that these guard conditions cannot be evaluated until the read result becomes available from the memory read action of node 804.

In one embodiment of the invention, an ordering of the actions is created by the visitation order of a breadth-first search of the dependency graph 800 beginning from the nodes for the input nodes and any other nodes without an incoming edge. For the example dependency graph 800, only node 802 does not have an incoming edge and the depth-first search beginning from node 802 may visit the nodes in the order 802, 804, 806, 808, 810, and 812.

The created ordering tends to distribute the nodes within the order according to the number of levels of dependencies of the nodes. In addition, adjacent nodes in the order, such as nodes 806 and 808, tend to have no dependency between them when they come from the same level of the dependency graph 800. This lack of dependency between some adjacent nodes in the ordering may permit the corresponding actions to be performed in parallel within a stage of the pipeline.

Figure 9:
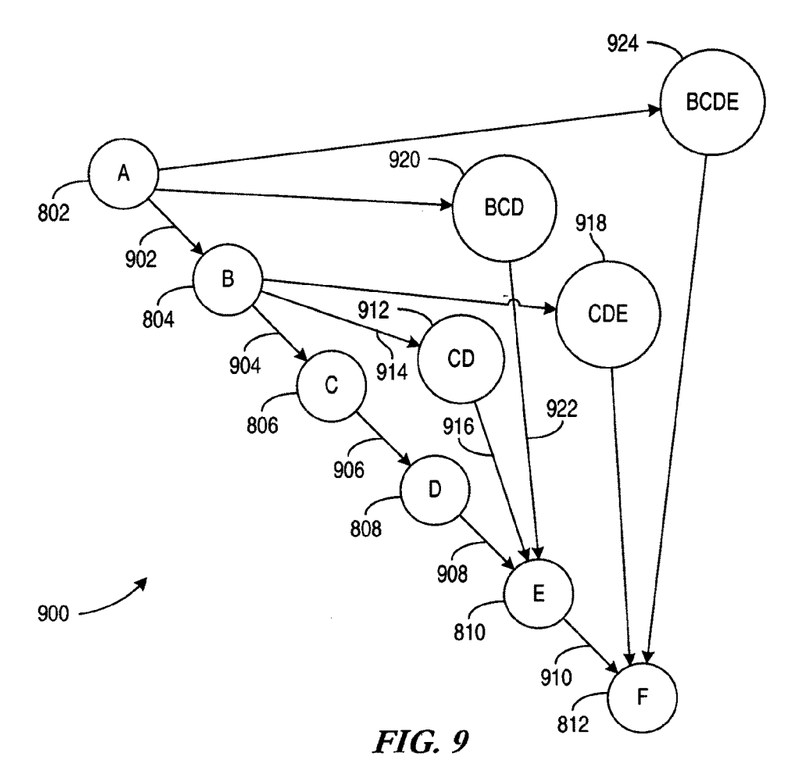
FIG. 9 is a diagram of a solution graph for generating a pipeline for processing a type of network packets in accordance with various embodiments of the invention.

FIG. 9 is a diagram of a solution graph 900 for generating a pipeline for processing a type of network packets in accordance with various embodiments of the invention. The solution graph 900 is initialized with the nodes 802 through 812 from the dependency graph 800, with edges 902 through 910 connecting these nodes according to the ordering from the breadth-first search of the dependency graph 800.

Each path through the solution graph 900 from node 802 to 812 corresponds to an assignment of the actions to the stages of a pipeline. The path initially created in the solution graph corresponds to a pipeline with a number of stages equaling the number of actions and the stages ordered according to the ordering from the breadth-first search of the dependency graph 800. For the example shown, the initial path from node 802 through edge 902 to node 804 through edge 904 to node 906 and similarly on to node 812 corresponds to a pipeline with four stages that is pipelined to successfully implement the actions of nodes 804, 806, 808, and 810.

To create additional assignments, action nodes with an edge between them may be combined to create new nodes that are added to the solution graph. The combining of nodes does not combine the nodes 802 and 812 for the input and output ports with any of the action nodes 804, 806, 808, and 810. For example, nodes 806 and 808 have an edge 906 between them and these nodes may be combined to create the new node 912. For each edge 904 that is directed to either of the combined nodes 806 or 808 from a third node 804, a new edge 914 is created that is directed from the third node 804 to the new node 912. For each edge 908 that is directed from either of the combined nodes 806 or 808 to a third node 810, a new edge 916 is created from the new node 912 to the third node 810.

Similarly, nodes 912 and 810 have and edge 916 between them and may be combined to form a new node 918. Nodes 804 and 912 have an edge 914 between them and may be combined to form new node 920. Nodes 920 and 810 have an edge 922 between them and may be combined to form the new node 924. The path from node 802 to node 924 to node 812 corresponds to the pipeline with one stage that performs all of the actions. For clarity, not all possible combinations of nodes are shown.

It will be appreciated that initializing the solution graph 900 with an initial path from a bread-first search of the dependency graph 800 may increase efficiencies in generating good assignments by limiting the search space of possible assignments of the actions to stages of a pipeline. Another search of the dependency graph 800, such as a topological sort, may be used to establish the initial ordering. In addition, a different or larger search space of assignments may be considered by eliminating the separate solution graph 900 and instead directly combining actions nodes in the dependency graph 800.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable media or delivery channels such as magnetic or optical disks or tapes, electronic storage devices, or as application services over a network.

The present invention is thought to be applicable to a variety of systems for generating a processor of network packets. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A processor-based method for generating a hardware description language (HDL) specification of a network packet processor, comprising:

inputting a first specification in a textual language that specifies at least one handler of the network packet processor for processing a first plurality of network packets and producing a second plurality of network packets, each handler for processing a corresponding type of network packets and including at least one action for inspecting and modifying at least one field of a plurality of fields of the corresponding type of network packets;

inputting a second specification in the textual language that specifies a plurality of characteristics of a plurality of ports of the network packet processor, the characteristics including respective data widths of the ports, the ports including at least one input port for receiving the first plurality of network packets and at least one output port for transmitting the second plurality of network packets;

inputting a third specification in the textual language that specifies at least one behavioral constraint of the network packet processor; and generating by a processor a fourth specification of the network packet processor in the HDL in response to the first, second, and third specifications.

2. The processor-based method of claim 1, wherein the inputting of the first, second, and third specifications comprises the inputting of the first, second, and third specifications in response to user input.

3. The processor-based method of claim 1, wherein the first specification specifies the fields of the corresponding type of network packets that is processed by each of the at least one handler, and wherein the third specification specifies the at least one behavioral constraint that is a behavioral constraint on a timing of the network packet processor or a behavioral constraint on a circuit area of the network packet processor or a behavioral constraint on a power consumption of the network packet processor.

4. The processor-based method of claim 1, further comprising synthesizing a hardware implementation of the network packet processor from the fourth specification of the network packet processor.

5. The processor-based method of claim 1, wherein the first specification specifies, for each of the at least one input port, a first handler for processing the corresponding type of the first plurality of network packets received at the input port.

6. The processor-based method of claim 5, wherein the first specification specifies, for each of the at least one output port, a second handler for producing the corresponding type of the second plurality of network packets transmitted at the output port.

7. The processor-based method of claim 6, wherein the first specification specifies the first handler for an input port that is also the second handler for an output port.

8. The processor-based method of claim 6, wherein the first specification specifies the first handler for an input port that produces a third plurality of network packets, and the first specification also specifies the second handler for an output port that processes the third plurality of network packets.

9. The processor-based method of claim 1, wherein the first specification specifies that the at least one handler includes a chain of a plurality of handlers, and for each first handler and successive second handler of the chain, the first handler includes a handle action for invoking the second handler.

10. The processor-based method of claim 9, wherein a foremost handler in the chain of a plurality of handlers processes the corresponding type of the first plurality of network packets received at an input port and the last handler in the chain of a plurality of handlers produces the corresponding type of the second plurality of network packets transmitted at an output port.

11. The processor-based method of claim 1, wherein the first specification specifies that each of the at least one handler includes a plurality of actions for processing the corresponding type of network packets.

12. The processor-based method of claim 11, wherein the first specification specifies a respective guard condition for each of at least one of the actions, the respective guard condition for enabling and disabling the action in response to at least one of state data and at least one of the fields of the corresponding type of network packets of the handler that includes the action.

13. The processor-based method of claim 11, wherein the actions of the handler include at least one of a set action for setting a value of a field of the corresponding type, a read action for reading a value from a peripheral of the network packet processor, a write action for writing a value to the peripheral of the network packet processor, an insert action for data insertion at a field of the corresponding type, and a remove action for data removal at a field of the corresponding type.

14. The processor-based method of claim 11, wherein the actions of the handler include at least one of an update action for updating a value of state data, a join action for combining a plurality of the network packets into a single network packet, a split action for dividing one of the network packets into a plurality of network packets, a forward action for transferring a type of network packets, and a handle action for invoking another of the at least one handler.

15. The processor-based method of claim 11, wherein the first specification specifies a chain of a plurality of collections of the actions of the at least one handler, each collection including a subset of the actions of a handler.

16. The processor-based method of claim 15, wherein the first specification specifies that for each first collection and successive second collection of the chain, the second collection of the actions is dependent on the first collection of the actions.

17. The processor-based method of claim 16, wherein the first specification specifies the handler that includes the actions of the first collection and the handler that includes the actions of the second collection are a same handler.

18. The processor-based method of claim 16, wherein the first specification specifies that the actions of the first collection include a handle action for invoking the handler that includes the actions of the second collection.

19. A program storage medium, comprising:
a processor-readable device configured with instructions for generating a hardware description language (HDL) specification of a network packet processor, wherein execution of the instructions by one or more processors causes the one or more processors to perform operations including:

inputting a first specification in a textual language that specifies at least one handler of the network packet processor for processing a first plurality of network packets and producing a second plurality of network packets, each handler for processing a corresponding type of network packets and including at least one action for inspecting and modifying at least one of a plurality of fields of the corresponding type of network packets;

inputting a second specification in a textual language that specifies a plurality of characteristics of a plurality of ports of the network packet processor, the characteristics including respective data widths of the ports, the ports including at least one input port for receiving the first plurality of network packets and at least one output port for transmitting the second plurality of network packets;

inputting a third specification in a textual language that specifies at least one behavioral constraint of the network packet processor; and generating a fourth specification of the network packet processor in the HDL in response to the first, second, and third specifications.

20. A system for generating a hardware description language (HDL) specification of a network packet processor, comprising:

means for inputting a first specification in a textual language that specifies at least one handler of the network packet processor for processing a first plurality of network packets and producing a second plurality of network packets, each handler for processing a corresponding type of network packets and including at least one action for inspecting and modifying at least one of a plurality of fields of the corresponding type of network packets;

means for inputting a second specification in a textual language that specifies a plurality of characteristics of a plurality of ports of the network packet processor, the characteristics including respective data widths of the ports, the ports including at least one input port for receiving the first plurality of network packets and at least one output port for transmitting the second plurality of network packets;

means for inputting a third specification in a textual language that specifies at least one behavioral constraint of the network packet processor; and means for generating a fourth specification of the network packet processor in the HDL in response to the first, second, and third specifications.

* * * * *